United States Patent [19]

Kasukabe et al.

[11] Patent Number: 4,931,726
[45] Date of Patent: Jun. 5, 1990

[54] APPARATUS FOR TESTING SEMICONDUCTOR DEVICE

[75] Inventors: Susumu Kasukabe; Masasi Ookubo, both of Yokohama; Yutaka Akiba, Fujisawa; Minoru Tanaka, Yokohama; Hitoshi Yokono, Toride, all of Japan

[73] Assignee: Hitachi, Ltd., Tokyo, Japan

[21] Appl. No.: 209,637

[22] Filed: Jun. 21, 1988

[30] Foreign Application Priority Data

Jun. 22, 1987 [JP] Japan ................... 62-153267
Jun. 30, 1987 [JP] Japan ................... 62-161332
Sep. 11, 1987 [JP] Japan ................... 62-226351

[51] Int. Cl.$^5$ .................. G01R 15/12; G01R 31/00
[52] U.S. Cl. ................. 324/158 F; 324/158 P; 439/482
[58] Field of Search .......... 324/158 P, 158 F, 73 PC, 324/72.5; 439/819, 482

[56] References Cited

U.S. PATENT DOCUMENTS

| 4,035,723 | 7/1977 | Kraternik | 324/158 P X |
| 4,504,780 | 3/1985 | Marsella | 324/158 P X |
| 4,508,405 | 4/1985 | Damon et al. | 324/158 F X |
| 4,528,500 | 7/1985 | Lightbody et al. | 324/158 F X |
| 4,593,243 | 6/1986 | Lao et al. | 324/158 F |
| 4,618,820 | 10/1986 | Salvagno et al. | 324/158 P X |
| 4,724,383 | 2/1988 | Hart | 324/158 F |

FOREIGN PATENT DOCUMENTS

| 0256386 | 2/1988 | European Pat. Off. | 324/158 F |
| 3115787 | 11/1982 | Fed. Rep. of Germany | 324/158 P |
| 3438967 | 5/1985 | Fed. Rep. of Germany | 324/158 P |
| 3533227 | 4/1986 | Fed. Rep. of Germany | 324/158 P |
| 58-73129 | 2/1983 | Japan . | |

Primary Examiner—Reinhard J. Eisenzopf
Assistant Examiner—Vinh P. Nguyen
Attorney, Agent, or Firm—Fay, Sharpe, Beall, Fagan, Minnich & McKee

[57] ABSTRACT

A semiconductor device testing apparatus which has a plurality of probes and plurality of coaxial cables connected therewith for impedance matching and a plurality of springs for providing flexibility to the individual probes to absorb a level difference in the surface of a semiconductor device.

The apparatus constructed in this manner allows for an effective test of a semiconductor device with a high density electrode arrangement.

10 Claims, 6 Drawing Sheets

APPARATUS FOR TESTING SEMICONDUCTOR DEVICE

BACKGROUND OF THE INVENTION

This invention relates to testing of semiconductor devices or semiconductor integrated circuits and more particularly to an apparatus and method for testing semiconductor integrated circuits which is capable of effectively testing the characteristic thereof even when the testing object has a level difference and an obstacle.

The previously known testing method for semiconductor integrated circuit was as follows. As shown in FIG. 8a and FIG. 8b, electrodes 3 are formed on the peripheral portion of each of semiconductor device chips included in a wafer 1 using a vapor deposition, sputtering or plating technique. These electrodes are used for testing of the semiconductor device chip. More specifically, as shown in FIGS. 2 and 3, probes 5 (e.g. tungsten needle) which protrude in the slanted downward direction from a probe card 4 so as to oppose to each other are brought into contact with the electrodes 3 so that their tip rubs the electrodes due to the bending of the probes 5, thereby testing the electric characteristic of the semiconductor devices.

However, in the prior art mentioned above, each probe 5 is as long as several tens of mm's so that the convergence inductance is large, which provides a limitation to the testing using high speed signals.

More specifically, assuming that the characteristic impedance of a signal line on the probe card 4 is R and the convergence inductance is L, the time constant is L/R. Now, if R=50 Ω, and L=50 nH, the time constant=1 nS. When the high speed signal having such a small time constant is handled, a square signal waveform is distorted, thus making it impossible to carry out the testing with high accuracy. Therefore, only the D.C. characteristic testing is commonly carried out. Further, the above method of using the probes provides a certain limitation to the spacial arrangement of the probes, which make it impossible to aptly realize the high density of electrodes of the semiconductor device and the increase of the total number thereof.

In order to overcome such a difficulty, the following method has been proposed. As shown in FIG. 4, soldering balls 6 for solder melting connection are provided on the electrodes (not shown) of the semiconductor device chip 2. This chip 2 is connected with a wiring substrate 7, as shown in FIG. 5, (e.g. ceramic multilayer substrate) by soldering the soldering balls 6 to electrodes 8 provided on the surface of the wiring substrate 7. This method is suitable to high density packaging or lump connection which provides a high yield rate. Thus, this method has been widely used.

With the development of the high density of the semiconductor device, the testing thereof using the high speed signals has been required. A method for testing, using such high speed signals, the characteristic of a semiconductor device in which soldering balls for soldering connection are provided on the electrodes thereof is disclosed in, for example, JP-A-No. 58-73129. This method is as follows. As shown in FIG. 7, a probe card 11 is a multi-layer substrate with lines having a certain characteristic impedance which are formed using, as reference layers, a signal conductor wiring 9 and a power source conductor layer 10. The probe card 11 is also provided, on its surface, with protrusion electrodes 12 of nickel plated tungsten at the positions corresponding to the electrodes of the semiconductor device 2. In testing, the probe card 11 is heated by a heat source 13, as shown in FIG. 6, which is provided on the surface of the card opposite to that on which the protrusion electrodes 12 are provided, and the protrusion electrodes 12 are held to the soldering balls 6. A connection is made between the protrusion electrode 12 and the soldering balls 6 through a solder welding technique. Then, signal communication is carried out therebetween to test the semiconductor device. After the testing has been completed, the probe card 11 is heated again to melt the solder, and separate the protrusion electrode 12 from the soldering balls.

This method permits the high speed electrical characteristic of the semiconductor device to be tested, but provides heat stress to the semiconductor device since the soldering balls on the electrodes thereof must be melted, and also requires a long time due to poor workability of testing. Further, this method can not be employed if there are some obstacles (e.g. servicing wirings) against the probing in a cooling fin for preventing the self-heating of the semiconductor device or an electrode pad of the substrate on which the semiconductor device is provided or there is a level difference on the surface with which the probe electrodes are brought into contact.

Thus, in order to effectively test the semiconductor device, there is needed a method and apparatus for testing the high speed electric characteristics of the semiconductor device which can test them for a short time without providing heat stress to the semiconductor device and can deal with a great number of electrodes arranged with high density, electrodes having level differences or a complicated spacial arrangement thereof.

SUMMARY OF THE INVENTION

An object of this invention is to provide a method and apparatus for testing a semiconductor device which can effectively test the semiconductor device even if there is a level difference or an obstacle in the test object and can test it using high speed electric signals.

In order to attain this object, the test apparatus according to this invention is provided with a plurality of probes, in contact with the semiconductor device which is a test object, for communicating test signals, a spring for providing elasticity to the probes in the direction of absorbing the level difference in the surface of the semiconductor device, a plurality of coaxial cables electrically connected with the probes, and a test circuit electrically connected with the coaxial cables.

The test apparatus having the above arrangement, since the probes have elasticity, can be easily touched with test object electrodes having a certain degree of level difference.

Further, in accordance with this invention, the plurality of probes electrically connected with the coaxial cables have a similar shape to that of the latter. Namely, the probes comprise an electric signal communication path, an insulating portion surrounding the path, and a conductive portion surrounding the insulating portion. Therefore, the probes and the coaxial cables electrically connected therewith can be impedance-matched as a whole, thereby preventing high speed signals from being distorted.

The arrangement according to this invention will be explained slightly in detail.

First, there is provided means for constructing the probe by an insulating tube, an axial wire for communicating electric signal inserted into the insulating tube and a conductor fixed around the insulating tube. This means make it possible to prevent the distortion of the high speed signals since the probe and the coaxial cable have substantially the same characteristic. If the spring is previously fixed to a fixed substrate and the coaxial cable, the level difference in the test object can be absorbed.

Secondly, even when the axial wire of the coaxial cable is exposed to be used as a probe, the impedance from the probe to the test circuit can be matched.

In this case, the conductive substrate for fixing the coaxial cable is used as a common earth and also the tube for fixing the spring is externally fixed to the conductive substrate by a screw. The spring pressure can be adjusted by inserting the spring into the tube for fixing it and also selecting the position of screw fixing covering the spring. The position of the axial wire of the coaxial cable used as a probe can be adjusted by selecting the screw fixing position of the spring fixing tube and the substrate.

Thirdly, the probe can be constituted by two movable pins, and a spring and tube for connecting these movable pins.

In this case, the probe can be formed so as to have a suitable length enough to insert the spring and the two movable pins thereinto. Particularly, the portion of the movable pins which protrudes externally from the tube can be formed so as to have a short length (0.5 mm to 3 mm) and thus the distortion of the high speed signals can be reduced.

The movable pins, since they are externally pressed by elasticity of the spring, can be touched with the electrode by a predetermined force even if the electrode have some level differences.

The servicing of the probes or the change of a probing pattern can be easily dealt with by replacing the individual probes or the insulating substrate for holding the probes together with the probes.

Further, a complicated spacial arrangement having an obstacle such as a cooling fin can be dealt with by providing moderate elasticity to the coaxial cable so that it can be bended.

DESCRIPTION OF THE PREFERRED EMBODIMENTS

Figure 1A:
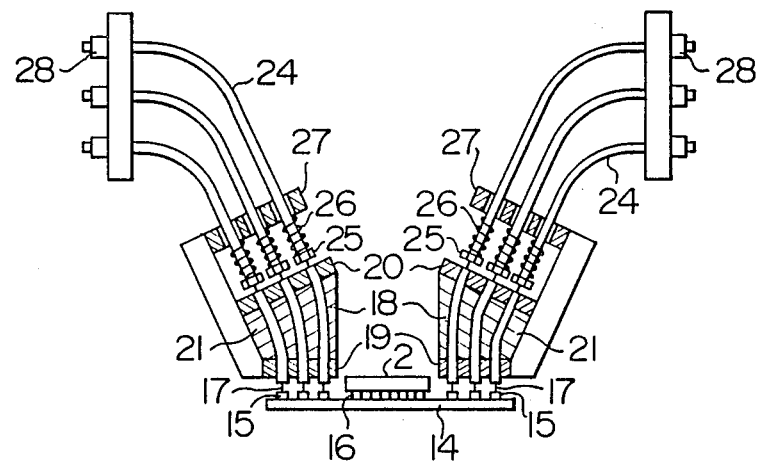
FIGS. 1a and 1b are sectional views of the main portion (excluding a test circuit) of a semiconductor device testing apparatus according to one embodiment of this invention.

Referring to the drawings, several embodiments of this invention will be explained.

Embodiment 1

Figure 1B:
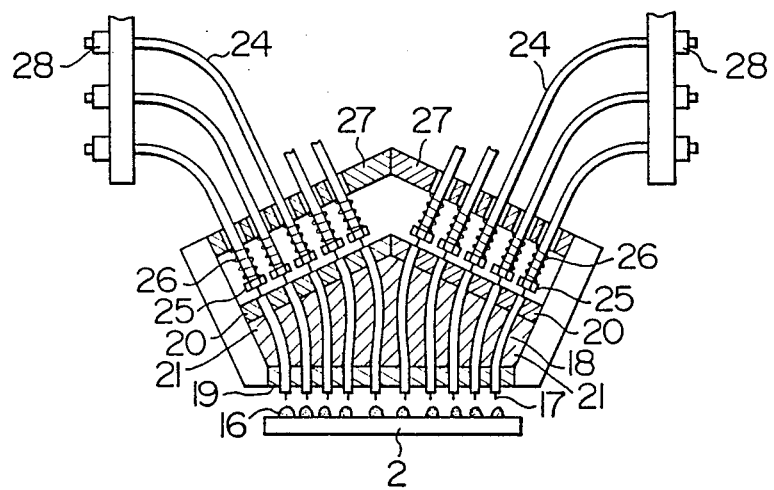
Figure 2:
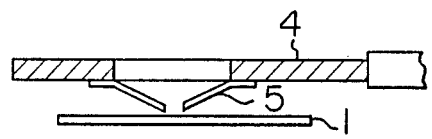
FIG. 2 is a sectional view of the semiconductor device testing apparatus according to the prior art.
Figure 3:
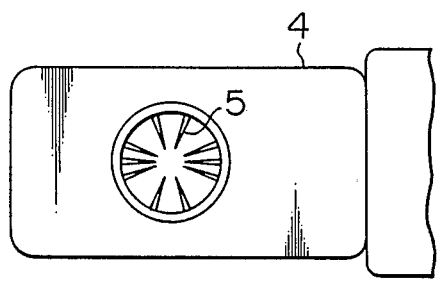
FIG. 3 is a plan view of FIG. 2 view from above.
Figure 4:
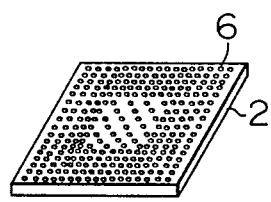
FIG. 4 is a perspective view of the surface of a semiconductor device in which soldering balls are provided on the electrodes thereof.
Figure 6:
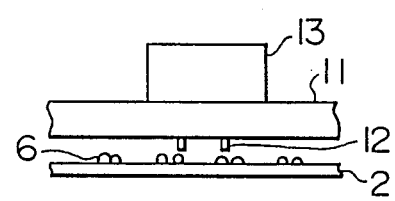
FIG. 6 is a sectional view of the prior art semiconductor device testing apparatus including a multi-layer substrate provided with protruding electrodes and a heat source.
Figure 5:
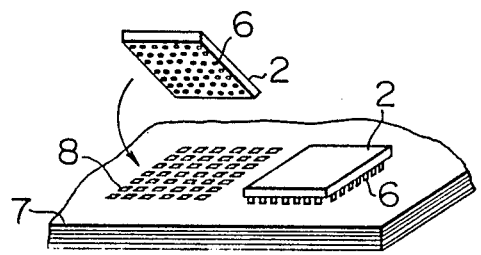
FIG. 5 is a perspective view of the packaging state of a semiconductor device packaged by soldering connection.
Figure 7:
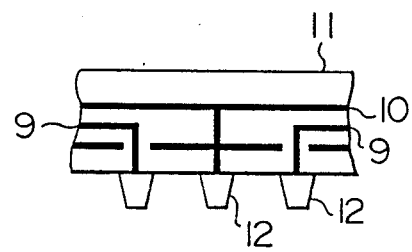
FIG. 7 is an enlarged sectional view of the internal layer portion in the semiconductor device testing apparatus of FIG. 6.
Figures 8A, 8B:
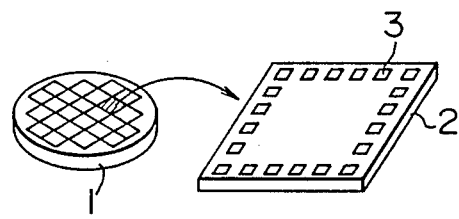
FIGS. 8a and 8b show a perspective view of a conventional exemplary electrode arrangement of a semiconductor device in which electrodes are provided only in the periphery thereof.
Figure 9:
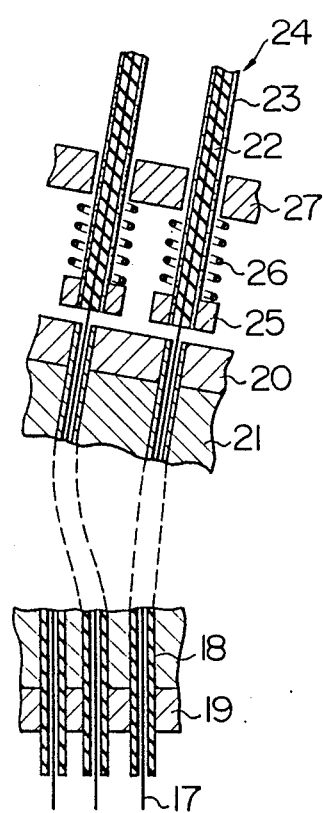
FIG. 9 is an enlarged sectional view of the part relative to the probes and coaxial cables shown in FIG. 1.

FIGS. 1a and 1b show the main part of a semiconductor device testing apparatus according to a first embodiment of this invention. FIG. 9 shows the detailed section of the probing head portion thereof. More specifically, FIG. 1a relates to the case where the contact object for probing is electrodes 15 formed on the surface of a support plate or substrate on which a semiconductor device is mounted. FIG. 1b relates to the case where the contact object for probing is electrodes 16 formed on the surface of the semiconductor device 2 by soldering balls or the like.

As seen from FIGS. 1a and 1b, an axial wire 17 is used for probing and a tube 18 having an inner diameter slightly larger than the outer diameter of the axial wire 17 has one end inserted into and fixed to one of through-holes formed in a support plate 19 and the other end also inserted into and fixed to one of through-holes formed in another support plate 20. The axial wire 17 is made of tungsten having moderate flexibility. The tube 18 is made of an insulating material such as Polytetrafluoroethylene. The support plates 19 and 20 are made of a conductive material such as brass, copper, etc.

The through-holes in the support plate 19 are located at the positions corresponding to the electrodes 15 or 16 for testing the electrical characteristic of the semiconductor device 2. The through-holes in the support plate 20 are arranged at the pitch slightly longer than the electrodes 15 or 16. The insulating tube 18 is fixed between the support plates 19 and 20 by bending the tube 18 so as to have a desired length.

The insulating tube 18 is shielded by a conductive material 21 (e.g. conductive paint obtained by mixing silver powder in epoxy resin) filled around the tube 18, which is grounded through both support plates 19 and 20. The insulating tube 18 may be also shielded by painting the conductive paint on the outer surface of the tube 18 or covering it with a meshed conductor.

Probes are formed by movably passing the axial wires 17 one by one through each of the shielded insulating tubes 18 and fabricating the tip of the wire 17 extracted from the support plate 19 side of the tube 18 into a needle shape.

As seen from FIG. 9 coaxial cables 24 are formed by covering each of the wires 17 extracted from the support plate 20 side of the tube 18 with an insulating material 22 of e.g. Polytetrafluoroethylene and further with a shielding member 23 (e.g. stainless pipe). Each of the coaxial cables 24 is movable passed through each of the through-holes, which has a dimeter slightly larger than the outer diameter of the coaxial cable 24, formed in a third support plate 27 (also made of a conduction material such as brass, copper, etc.) at the positions corresponding to the through-holes in the support plate 20.

Springs 26, which are mounted to surround the coaxial cables 24 between flanges 25 provided at the ends of the coaxial cable 24 and the support plate 27, are used to press the coaxial wires 17 in the direction of bringing into contact with the electrodes 15 or 16.

The coaxial cable 24 are adapted to be connected with a testing circuit (not shown) through coaxial connectors 28, as seen in FIG. 1.

Figure 10:
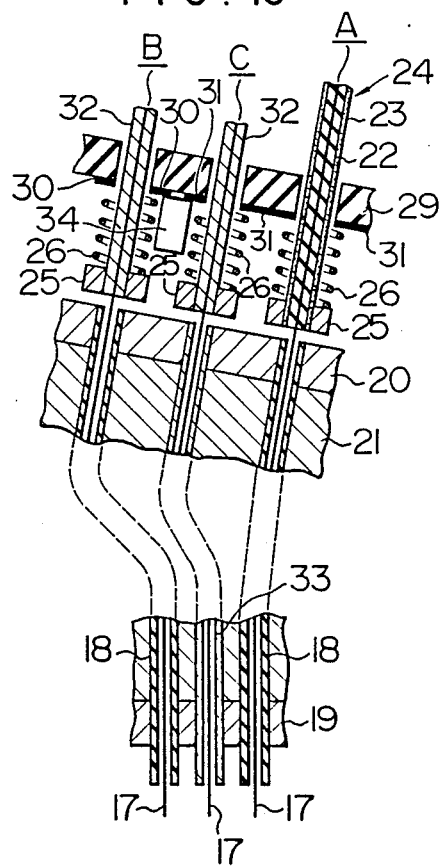
FIG. 10 is a sectional view of the application of the embodiment of this invention to the case where a probe for a power supply and a probe for an earth are provided in addition to probes for signals.

The above explanation of this embodiment relates to the testing apparatus comprising only signal probes. However, the basic idea of this embodiment is applicable to the testing apparatus comprising a power supply probe and a grounding probe in addition to the signal probes. In an alternative embodiment shown in FIG. 10, a support plate 29 made of an insulating material e.g. ceramic, glass, etc. is used in place of the conductive supporting plate 27 shown in FIGS. 1 and 9. This insulating support plate 29 is provided with a thick film circuit 30 permitting to apply a predetermined voltage for a power supply probe B and another thick film wiring 31 permitting to take common grounding for the shielding member 23 of a signal probe A and a grounding probe C. These wirings 30 and 31 can be made by a thick film printing technique for a conductor paste.

The power supply probe B is adapted to apply a voltage to the axial wire 17 through the spring 26. As seen from FIG. 10, as in the signal probe A, the axial wire 17 is movably passed through the insulating tube 18 fixed between the pair of support plates 19 and 20. The axial wire portion extracted from the supporting plate 20 side of the insulating tube 18 is covered with a tube 32 of a conductive material such as a stainless pipe. The spring 26 is mounted so that its one end abuts on the flange 25 provided at the end of the conductive tube 32 and its other end abuts on the wiring 30 on the support plate 29.

The grounding probe C is adapted to ground the axial wire 17 through the spring 26 bonded to the circuit 31 in the same arrangement as the power supply probe B except that the axial wire 17 is movably passed through a conductive tube 33 of e.g. a stainless pipe instead of the insulating tube 18.

Additionally, in order to stabilize the power supply voltage, a bypass capacitor or its equivalent structure 34 may be connected between wirings 30 and 31.

As described above, in this embodiment, each of the axial wires of the coaxial cables, used as a probe, is extracted from the coaxial cable and movably passed through each of the shielded tubes so that its tip is guided to the position corresponding to the electrode of a test object, and contact pressure to the electrode is applied to the axial wire through the spring. Therefore, the impedance from the probe to a testing circuit is matched, which permits the high speed electrical characteristic of a semiconductor device to be tested. Also, even if there is a level difference in or an obstacle on the electrodes of a test object, e.g. semiconductor device, the semiconductor device can be effectively tested for a short time with high reliability.

Embodiment 2

A second embodiment of this invention will be explained with reference to FIGS. 11 and 12.

Figure 11:
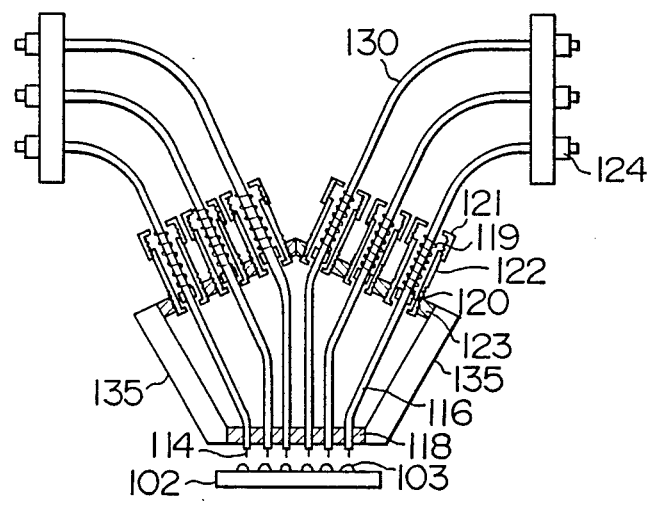
FIG. 11 is a sectional view of the main portion (excluding a test circuit) of a semiconductor device testing apparatus according to another embodiment of this invention.
Figure 12:
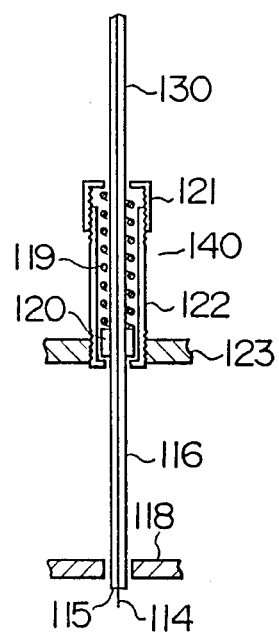
FIG. 12 is an enlarged sectional view of the part relative to the probes and the spring shown in FIG. 11.

As shown in FIGS. 11 and 12, each of coaxial cables 130 is inserted into each of the through-holes formed in a first supporting plate 118. The coaxial cable 130 is formed by covering a tungsten probe 114 with Polytetrafluoroethylene 115 and further shielding it by a stainless tube 116. The first supporting plate 118 is made of a conductive material such as brass, copper, etc. The through-holes, each of which has a diameter slightly larger than the outer diameter of the stainless tube 116, are located at the positions corresponding to electrodes 103 of a semiconductor device provided for measuring its electrical characteristic.

Springs 119 are provided at the upper position of the coaxial cables 130 with a desired clearance for the stainless tube 116, and their one end are held by rings 120 fixed to the stainless tube 116.

Tubes 122 are inserted into and fixed to the threaded grooves of a second supporting plate 123. Each tube 122 has a threaded cap 119 for covering the spring 119. The tubes 122 are made of a conductive material such as brass. The second support plate 123 is also made of a conductive material such as brass, copper.

The tungsten probes 114 are connected with a testing circuit (not shown) through coaxial connectors 124.

The first and second support plates 118 and 123 are fixed to a rib 135 made of e.g. brass and stainless. The resultant assembly is adapted to be movable in the three directions of X, Y and Z axes with respect to the electrode surface of the semiconductor device opposite to the assembly. Thus, by aligning the probes 114 with the electrode 103 pattern of the semiconductor device and thereafter pressing the entire group of the probes 114 to the electrode pattern, the probes 114 can be connected with the individual electrodes 103. With some level difference in the electrodes 103, the tips of the probes 114 can be surely connected with the electrodes 103 by the action of the springs 119. Thus, any level difference in the electrode height can be absorbed within the elastic stroke of the spring 119.

In accordance with this embodiment, even if there is a level difference in or an obstacle on the electrodes of a test object, e.g. semiconductor device, the semiconductor device can be effectively tested for a short time with high reliability.

The prior art testing device only could test the semiconductor device having up to about 200 electrodes per 1 $cm^2$. However, this embodiment of this invention can test the semiconductor device having an electrode arrangement density 5 to 10 times larger than the prior art.

Embodiment 3

A third embodiment of this invention will be explained with reference to FIGS. 13 to 16.

Figure 13:
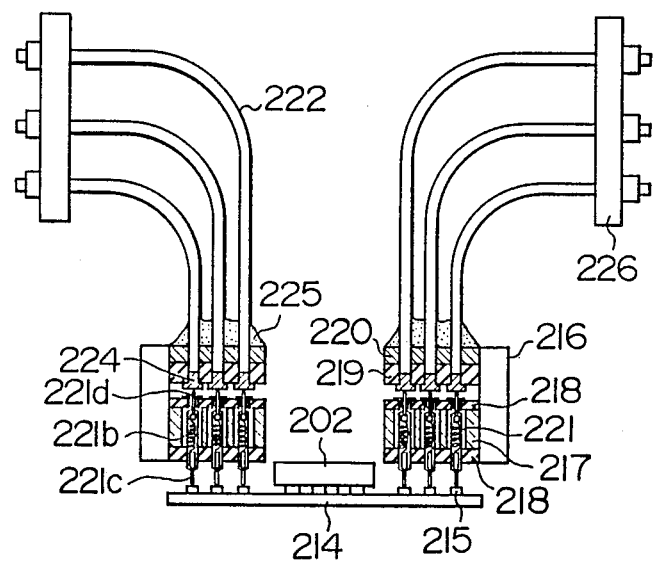
FIG. 13 is a sectional view of the main portion (excluding a test circuit) of a semiconductor device testing apparatus according to still another embodiment of this invention.
Figure 14:
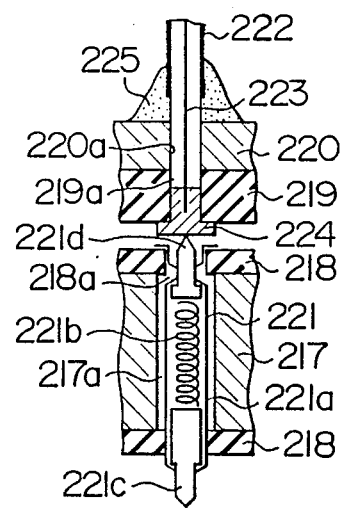
FIG. 14 is an enlarged sectional view of the part relative to the probe and coaxial cable shown in FIG. 13.

In FIGS. 13 and 14, 214 is a supporting plate held at a certain position on which a semiconductor device 202 is centrally placed. The supporting plate 214 is provided on both sides, with a plurality of electrodes 215 for electrical characteristic measurement.

216 is a housing supported by a positioning mechanism (not shown) and is adapted to be shiftable in both the horizontal and vertical directions. A pair of conductive support plates 217 are provided on both internal sides of the housing 216. A pair of insulating support plates 218 (made of e.g. ceramic, glass, etc.) are provided to be horizontally extended on the upper and lower sides of the conductive support plate 217 (The support plates 218 serve to hold probes 221). An insulating support plate 219 (made of e.g. ceramic, glass, etc.) is provided to be opposite to the upper insulating support plate 218 with a certain space therefrom (The insulating support plate 219 serves to hold axial wires). A conductive plate 220 (made of e.g. brass, copper, etc.) is provided in contact with the upper surface of the insulating support plate 219.

Each of the probes 221, the number of that is equal to that of the electrodes, is constituted by a conductive tube 221a (made of e.g. brass), a spring 221b and two movable pins 221c and 221d in which the two movable pins 221c and 221d are adapted to always externally protrude, in their tip, from both ends of the tube 221a by the elasticity of the spring 221b held in the tube 221a with a desired clearance therefrom. The probe 221 is held in each of through-holes 217a, which are provided in the support plate 217, with a desired clearance from the internal wall of the through hole.

The tube 221a is fixedly inserted, at its both ends, into through-holes 218a formed in the insulating support plate 218 at the position corresponding to the individual electrode 215 and fixed, in its upper end, by bending horizontally it on the upper surface of the support plate 218. Thus, the two movable pins 221c and 221d are adapted to always keep in contact with the electrode 215 and the end surface of a flanged electrode 224 for the axial wire 223.

The flanged electrode 224 is fixedly inserted into a through-hole 219a formed in the insulating support plate 219 at the position corresponding to the through-hole 218a and also fixed to the end portion of axial wire 223. This fixing is carried out by soldering, staking or laser welding technique.

The axial wire 223 is movably inserted into a through-hole 220a formed in the conductive supporting plate 220 at the position corresponding to through-hole 219a and is covered with e.g. Polytetrafluoroethylene. A shield 222 of the coaxial cable, also made of e.g. Polytetrafluoroethylene, is connected, in its front end portion, with the conductive support plate 220 by solder 225. The shield 222 is connected, in its rear end portion, with connected with a test circuit (not shown) through a coaxial connector 226.

Due to the construction of the semiconductor device testing apparatus as explained above, it is possible to fix the tube 221a of the probe 221 in the through hole 218a which is formed in the insulating support plate 218 with an accuracy of several microns for the electrode 215 for testing the electrical characteristic of the semiconductor device 202. Therefore, this embodiment of this invention can provide a proving device which is capable of positioning a great number of movable pins 221c and 221d arranged with a density 3 to 5 or more times higher than the prior probing device with a density of a pitch of 700 $\mu$m and 200 probes/cm².

Further, since the probe 221 is movably inserted in the through-hole 217a of the conductive support plate 217 with a desired clearance from the inner wall of the through-hole, the probe 221 can be shielded by grounding the conductive support plate 217. The length of the movable pins 221c and 221d externally protruding from both ends of the tube 221a can be shortened so that the convergence inductance thereof can be reduced, thereby greatly reducing the disorder of the high speed electrical signals such as crosstalk, reflection, etc. All the other wiring components are inpedance-matched and so the high speed electrical characteristic of the semiconductor device 2 can be effectively tested.

Since the movable pins 221c, 221d and the electrode 224 are individually provided at the fixed portion of the probe 221 and that of the shield 222 of the coaxial cable, respectively, a plurality of the probes 221 can be easily exchanged, thus facilitating the change or servicing of the probing pattern. Further, since the probe 221 can be easily extracted from the through-hole 218a one by one, it can easily individually exchanged.

Figure 15A:
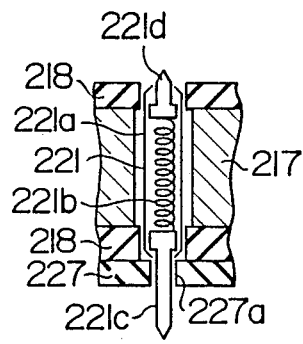
FIGS. 15a to 15e are sectional views of other constructions of the portion of supporting the probe shown in FIG. 13.
Figure 15B:
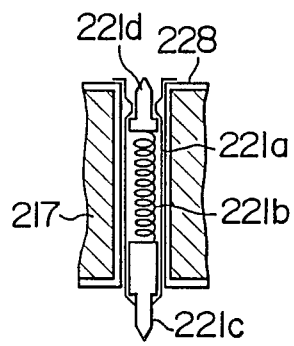
Figure 15C:
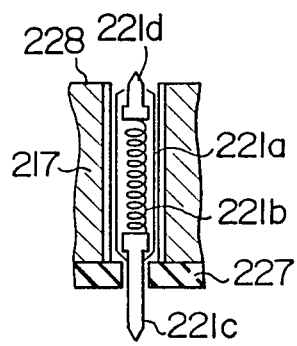
Figure 15D:
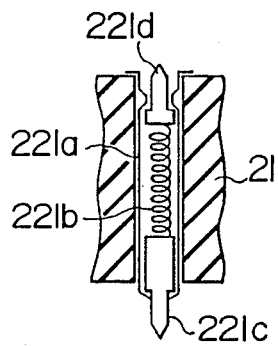
Figure 15E:
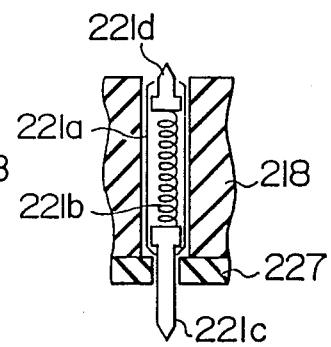

Additionally, in the embodiment mentioned above, the tube 221a is fixed to the insulating supporting plates 218 by horizontally (i.e. left and right) bending the upper portion thereof but may be fixed by other manners. For example, as shown in FIG. 15a, the tube 221a may be fixed to the insulating support plates 218 by fixing its lower end within a through-hole 227a of an insulating plate 227 provided on the lower surface of the lower one of the insulating support plates 218. This may also be made by filling an insulative material having a low dielectric constant (e.g. Polytetrafluoroethylene) into the opening between the tube 221a and the through-hole 217a of the conductive support plate 217, as shown in FIGS. 15a and 15b. If the probe 221 is relatively short, the tube 221a may be fixed to only the insulating support plate 218 (without using the conductive plate 217) as shown in FIG. 15d or may be fixed to the insulating support plate 218 and the insulating plate 227.

Figure 16A:
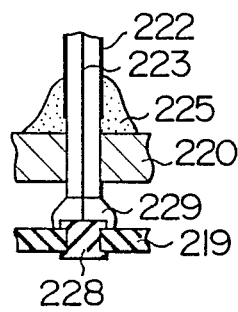
FIGS. 16a and 16b are sectional views of other constructions of the part relative to the coaxial cable and the portion of fixing the axial wire thereof shown in FIG. 13.
Figure 16B:
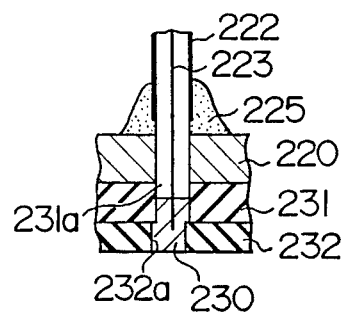

The shield 222 of the coaxial cable and the axial cable 223 may also be held, as shown in FIG. 16a, by forming an interval between the conductive support plate 220 and the insulating plate 219 for holding the axial wire 223, filling a conductive thick film electrode 228 (made of e.g. silver, pallodium, etc.) into the throughhole 219a of the insulating support plate 219 and connecting the conductive thick film electrode 228 with the axial wire 223 by solder 229 in the state where the tip of the axial wire 223 is kept in contact with the conductive thick film electrode 228. This may be also made, as shown in FIG. 16, by inserting the end portion of the axial wire 223 and an electrode 230 (made of e.g. copper or brass) fixed thereto (by the soldering, staking or leser welding technique) into the through-holes 231a and 232a of insulating plates 231 and 232 (made of e.g. ceramic or glass) and shifting the relative positions of the insulating plates 231 and 232 to fix the electrode 230 and further by connecting the shield 222 of the coaxial cable with the conductive plate 220 above the electrode 230 by the solder 225.

In accordance with this embodiment, even if there is a level difference in or an obstacle on the electrode of a test object, e.g. semiconductor device, the semiconductor device can be effectively tested. The positioning of each probe in probing and the servicing thereof can be easily effected so that the probing pattern can be easily changed and also the semiconductor device can be tested using high speed electric signals.

We claim:

1. A semiconductor device testing apparatus comprising:
 a plurality of probes for communicating test signals in contact with electrodes of a semiconductor device which is a test object, wherein each of said plurality of probes is composed of an axial wire, and an insulating tube having upper and lower portions surrounding the axial wire, first and second support plates for supporting the insulating tube at its said upper and lower portions, and a conductor material inserted between said first and second support plates;
 a plurality of springs for providing elasticity to the probes in the direction of absorbing level differences in the surface of the semiconductor device;
 a plurality of coaxial cables electrically connected with said probes; and,
 a testing circuit electrically connected with said axial cables.

2. The semiconductor device testing apparatus according to claim 1, further comprising a third support plate for supporting each of the plurality of springs and having a plurality of through-holes for passing said coaxial cables.

3. The semiconductor device testing apparatus according to claim 1, wherein the pitch between said insulating tubes is larger at the location of the second support plate than at a location of the first supporting plate.

4. A semiconductor device testing apparatus comprising:
 a plurality of probes for communicating test signals in contact with electrodes of a semiconductor device which is a test object;
 a plurality of springs for providing elasticity to the probes in the direction of absorbing level differences in the surface of the semiconductor device;
 a plurality of coaxial cables electrically connected, with said probes; and
 a testing circuit electrically connected with said coaxial cables
 wherein each of said plurality of probes is composed of a coaxial wire, and first and second support plates for supporting each of said coaxial wire, and
 wherein the first support plate is comprised of conductive material having a through-hole pattern for positioning provided in accordance with the electrodes of the semiconductor device.

5. The semiconductor testing apparatus according to claim 4, wherein the second support plate for supporting said spring is comprised of conductive material having through-holes he interval between which is larger than that between through-holes of said first supporting plate.

6. A semiconductor device testing apparatus comprising:
 a plurality of probes adapted to be brought into contact with electrodes of a semiconductor device which is a test object, each probe being composed of a first movable pin to be brought into contact with the individual electrodes of the semiconductor device, a second movable pin connected to said first movable pin through a spring and a tube surrounding said spring;
 a probe support plate means for supporting said plurality of probes having a structure allowing the probes to be removed as a single unit;
 a plurality of coaxial cables each electrically connected with the second movable pin of each of the plurality of probes; and
 a testing circuit electrically connected to said plurality of coaxial cables.

7. The semiconductor device testing apparatus according to claim 6, wherein said probe support plate means is comprised of two insulating plates surrounding said first and second movable pins and a conductive plate inserted between the insulating plates.

8. The semiconductor device testing apparatus according to claim 7, comprising a housing for unifying a cable support plate for supporting the coaxial cable and said probe support plate.

9. The semiconductor device testing apparatus according to claim 6, wherein the probe comprised of the first movable pin to be brought into contact with the individual electrode of the semiconductor device, and the second movable pin connected to the first movable pin through the spring and the tube surrounding the spring are further comprised as complete individual units thereby allowing the probe to be easily removed and interchanged.

10. An apparatus for testing semiconductor devices comprising:
 a plurality of independently positionable probes adapted to be brought into contact with electrodes of varying levels located throughout the entire area of a semiconductor device, wherein each of said plurality of probes are complete individual interchangeable units including:
 a first movable pin to be brought into contact with an individual electrode located on the semiconductor device, and a second movable pin connected to the first movable pin through a spring and a tube surrounding the spring;
 a plurality of coaxial cables electrically connected with the plurality of probes; and
 a plurality of first and second support plates for supporting the coaxial cables and tubes, respectively wherein through-holes located in the second support plates hold said tubes.

* * * * *